(12) United States Patent
Bianchi (10) Patent No.: US 9,712,133 B2
(45) Date of Patent: Jul. 18, 2017

(54) SWITCHABLE SIGNAL ROUTING CIRCUIT

(71) Applicant: Giovanni Bianchi, Nufringen (DE)

(72) Inventor: Giovanni Bianchi, Nufringen (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 14/841,601

(22) Filed: Aug. 31, 2015

(65) Prior Publication Data
US 2015/0372657 A1 Dec. 24, 2015

Related U.S. Application Data

(63) Continuation of application No. PCT/EP2013/054303, filed on Mar. 4, 2013.

(51) Int. Cl.
| | | |
|---|---|---|
| *H01P 1/10* | (2006.01) | |
| *H03H 7/06* | (2006.01) | |
| *H03H 7/38* | (2006.01) | |
| *G06F 17/50* | (2006.01) | |

(52) U.S. Cl.
CPC ......... *H03H 7/383* (2013.01); *G06F 17/5063* (2013.01); *H03H 7/06* (2013.01)

(58) Field of Classification Search
CPC .............. H01P 1/10; H01P 5/04; H03H 7/06
USPC ....... 333/101, 103–105, 130, 81 R; 327/308; 341/144
See application file for complete search history.

(56) References Cited

U.S. PATENT DOCUMENTS

| | | | | | |
|---|---|---|---|---|---|
| 4,129,839 | A | * | 12/1978 | Galani | H01P 5/12 330/124 R |
| 4,736,427 | A | * | 4/1988 | Medin | H04N 17/00 331/44 |
| 5,351,030 | A | * | 9/1994 | Kobayashi | H03H 7/24 333/81 R |
| 5,363,070 | A | * | 11/1994 | Arimoto | H03H 7/24 323/353 |
| 6,166,672 | A | * | 12/2000 | Park | H03M 1/682 341/145 |
| 6,577,198 | B1 | | 6/2003 | Bayruns | |
| 7,095,347 | B2 | * | 8/2006 | Hirata | G05F 3/22 341/144 |
| 9,369,112 | B2 | * | 6/2016 | Bianchi | H03H 11/245 |
| 2003/0169104 | A1 | | 9/2003 | Huckins | |
| 2014/0361847 | A1 | * | 12/2014 | Goldblatt | H03K 17/007 333/101 |

FOREIGN PATENT DOCUMENTS

WO    WO97/28598    8/1997

OTHER PUBLICATIONS

Sorrentino, R., and G. Bianchi, Microwave and RF Engineering, 2010, pp. 205-209 and 363-400, John Wiley & Sons, Ltd.

* cited by examiner

*Primary Examiner* — Dean Takaoka (57) ABSTRACT

A switchable signal routing circuit for routing a signal between at least one input port and at least one output port is provided. The ports are connected via variable resistors to a common node, wherein the switchable signal routing circuit is configured to set resistance values of the variable resistors in dependence on a number of active ports.

19 Claims, 9 Drawing Sheets

FIG 1

| N | $R_k$ | $20*\log_{10}(S_{k,1})$ |
|---|---|---|
| 1 | 0.00 | 0.00 |
| 2 | 16.67 | -6.02 |
| 3 | 25.00 | -9.54 |
| 4 | 30.00 | -12.04 |
| 5 | 33.33 | -13.98 |
| 6 | 35.71 | -15.56 |
| 7 | 37.50 | -16.90 |
| 8 | 38.89 | -18.06 |
| 9 | 40.00 | -19.08 |
| 10 | 40.91 | -20.00 |
| 11 | 41.67 | -20.83 |
| 12 | 42.31 | -21.58 |
| 13 | 42.86 | -22.28 |
| 14 | 43.33 | -22.92 |
| 15 | 43.75 | -23.52 |
| 16 | 44.12 | -24.08 |

| FIG 7B | 0 | $\frac{1}{3}R_0$ | $\frac{2}{4}R_0$ | $\frac{3}{5}R_0$ | ... | $\frac{N-1}{N+1}R_0$ | $\infty$ |
|---|---|---|---|---|---|---|---|
| FIG 7C | 0 | $(N-1)*R_x$ | $(N-2)*R_x$ | $(N-3)*R_x$ | ... | $R_x$ | $\infty$ |

FIG 8

| N | Q |
|---|---|
| 1 | 1 |
| 2 | 1 |
| 3 | 2 |
| 4 | 2 |
| 5 | 3 |
| 6 | 3 |
| 7 | 3 |
| 8 | 3 |
| 9 | 4 |
| 10 | 4 |
| 11 | 4 |
| 12 | 4 |
| 13 | 4 |
| 14 | 4 |
| 15 | 4 |
| 16 | 4 |

SWITCHABLE SIGNAL ROUTING CIRCUIT

CROSS-REFERENCE TO RELATED APPLICATIONS

This application is a continuation of copending International Application No. PCT/EP2013/054303, filed Mar. 4, 2013, which is incorporated herein by reference in its entirety.

Embodiments of the present invention relate to a switchable signal routing circuit for routing a signal between at least one input port and at least one output port. Further embodiments relate to a method for operating a switchable signal routing circuit. Some embodiments relate to a combined RF variable splitter+switch (RF=radio frequency).

BACKGROUND OF THE INVENTION

It would be desirable to have a distributing network that is designed to send the signal of one input port to N output ports simultaneously, with the following additional requirements (or constraints):
1. The distributing network should be broadband, ideally from DC to infinite frequency (DC=direct current).
2. Each of the N output ports of the distributing network should be individually selectable as transmitting or not transmitting one.
3. As minimum requirement, the input port and all the M (1≤M≤N) output ports of the distributing network selected to transmit should be impedance matched.
4. As additional requirement, not only the M transmitting ports but also the remaining ones should be impedance matched, i.e. all the N+1 ports of the distributing network should be impedance matched, independently on which port(s) is(are) transmitting.
5. The insertion loss of the distributing network should be reduced (or even minimized).
6. The temperature dependency of the distributing network should be reduced (or even minimized).
7. The linearity of the distributing network should be increased (or even maximized).
8. The sensitivity of the distributing network to manufacturing process variations and the requirement of postproduction alignment should be reduced (or even minimized).

One possible structure that holds some—but not all—of the requirements listed above is the single pole N throw (SPNT) switch, wherein within this context, N is an integer multiple and stands for "multiple". A detailed description of the SPNT switch can be found in Roberto Sorrentino, Giovanni Bianchi: Microwave and RF Engineering, Ch. 10, pp. 363-389. The main drawback of the SPNT switch is that only one output port at the time can be selected among the available N output ports.

Thus, at least requirement 2 stating that each of the N output ports should be individually selectable as transmitting or not transmitting one is not satisfied.

Figure 1:
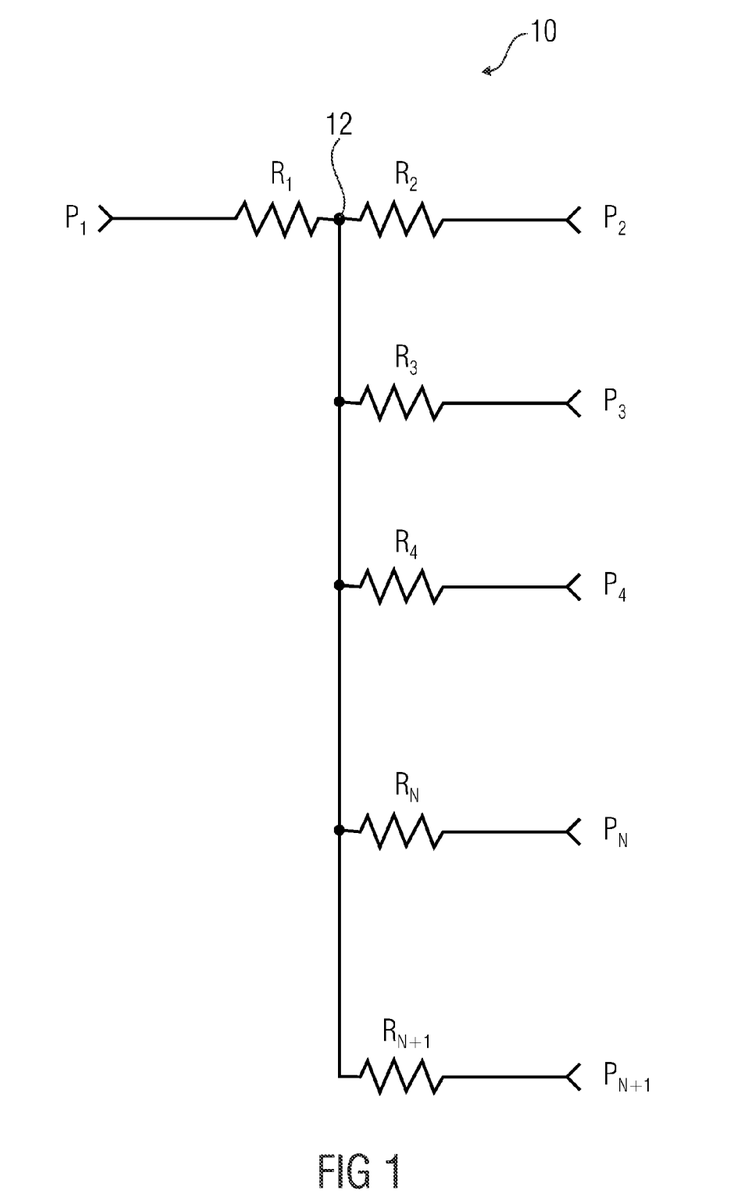
FIG. 1 shows a block diagram of a passive N-way splitter.

One other circuit which satisfies some—but again not all—the requirements listed above is the N-output splitter 10, schematized in FIG. 1. It consists of N+1 equal valued resistors, indicated in FIG. 1 as $R_1$ to $R_{N+1}$, and N+1 Ports, indicated in FIG. 1 as $P_1$ to $P_{N+1}$. The N+1 equal valued $R_1$ to $R_{N+1}$ resistors connect the N+1 Ports $P_1$ to $P_{N+1}$ to a common node 12. Thereby, the equal valued resistors $R_1$ to $R_{N+1}$ comprise fixed or constant resistance values.

The condition for simultaneously matching all of the N+1 ports $P_1$ to $P_{N+1}$ (i.e., for fulfilling requirement 3 stating that the input port and all of the M output ports selected to transmit should be impedance matched and requirement 4 stating that not only the M transmitting ports but also the remaining ones should be impedance matched) is:

$$R_k = \frac{N-1}{N+1} R_0 \ (1 \le k \le N+1) \tag{1}$$

where $R_0$ is the reference impedance, normally equal to 50Ω.

Under the condition described by equation (1) the scattering parameters of the network in FIG. 1 are $$s_{hk} = \frac{1}{N} \ (1 \le h, k \le N+1, h \ne k) \tag{2}$$

$$s_{hk} = 0 \ (1 \le k \le N+1) \tag{3}$$

as all the ports are totally equivalent.

Equation (3) confirms the impedance matching of the structure and needs no further comments. Equation (2) states that the splitter 10 transmits the input power to each of its N output ports $P_2$ to $P_{N+1}$ with an attenuation in linear units equal to the reciprocal of the number N of output ports $P_2$ to $P_{N+1}$ itself. From equation (2) it also follows that the ratio between the input power $P_{IN}$ (present at the input port $P_1$) and the output power $P_{OUT}$ globally transmitted to the output ports $P_2$ to $P_{N+1}$ is $$\frac{P_{OUT}}{P_{IN}} = \sum_{k=2}^{N+1} |s_{k,1}|^2 = \sum_{k=2}^{N+1} \left|\frac{1}{N}\right|^2 = \frac{1}{N} \tag{4}$$

In other words, only 1/N of the available input power $P_{IN}$ is shared between the output ports $P_2$ to $P_{N+1}$, where the remaining (N−1)/N of the available input power $P_{IN}$ is dissipated inside the structure 10. That could be in contrast with requirement 5 stating that the insertion loss of the distribution network should be reduced (or even minimized). On the other side, the only way to realize a non-dissipative N-way power divider structure is by using reactive elements instead of resistors. One of such possibility's is based on the so called Wilkinson power divider, as described in Giovanni Bianchi: Microwave and RF Engineering, Ch. 7, pp. 205-209. Unfortunately, reactive elements are inherently frequency-depending. Therefore, non-dissipative distributed networks can only be realized with relative bandwidth of relatively few octaves.

Figure 2:
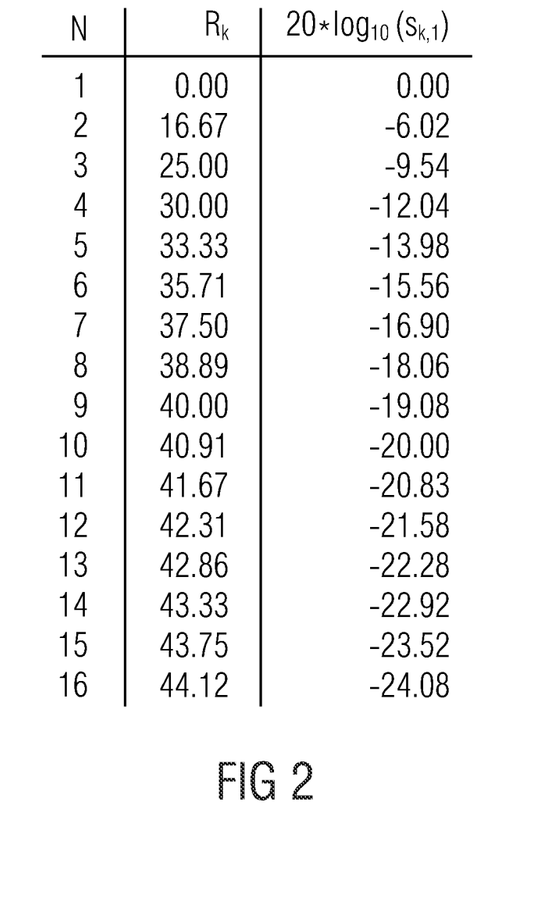
FIG. 2 lists in a table resistance values and transmission coefficients of N-way power splitters.

FIG. 2 lists in a table resistance values and transmission coefficients of N-way power splitters. In other words, FIG. 2 lists in a table the resistance values of the fixed equal valued resistors (assuming $R_0$=50Ω) and the input-output transmission coefficients for power splitters having a number of output ports from 1 to 16 (the 1-output power splitter is a trivial structure consisting of a direct input-output connection).

An additional requirement not fulfilled by the structure shown in FIG. 1 is requirement 2 stating that each of the N output ports $P_2$ to $P_{N+1}$ should be individually selectable as transmitting or not transmitting one.

SUMMARY

An embodiment may have a switchable signal routing circuit for routing a signal between at least one input port and at least one output port, wherein the ports are connected via variable resistors to a common node, wherein the switchable signal routing circuit is configured to set resistance values of the variable resistors in dependence on a number of active ports.

According to another embodiment, a method for operating a switchable signal routing circuit for muting a signal between at least one input port and at least one output port, wherein the ports are connected by means of variable resistors to a common node, may have the step of: setting resistance values of the variable resistors in dependence on a number of active ports.

Another embodiment may have a computer program having a program code for performing, when running on a computer or microprocessor, a method according to claim 17.

A switchable signal routing circuit for routing a signal between at least one input port and at least one output port is provided. The ports are connected via variable resistors to a common node, wherein the switchable signal routing circuit is configured to set resistance values of the variable resistors in dependence on a number of active ports.

Further, a method for operating a switchable signal routing circuit for routing a signal between at least one input port and at least one output port is provided. The ports are connected by means of variable resistors to a common node. The method comprises setting resistance values of the variable resistors in dependence on a number of active ports.

BRIEF DESCRIPTION OF THE DRAWINGS

Embodiments of the present invention will be detailed subsequently referring to the appended drawings, in which:

FIG. 6b shows a PIN diode based implementation of the variable resistor shown in FIG. 6a.

FIG. 6c shows a FET based implementation of the variable resistor shown in FIG. 6a.

DETAILED DESCRIPTION OF THE INVENTION

Equal or equivalent elements or elements with equal or equivalent functionality are denoted in the following description by equal or equivalent reference numerals.

Before embodiments of the present invention are described, a passive switchable power splitter which fulfills requirement 2 (stating that each of the N output ports should be individually selectable as transmitting or not transmitting one) by introducing additional SPST switches at the outputs is presented.

Figure 3:
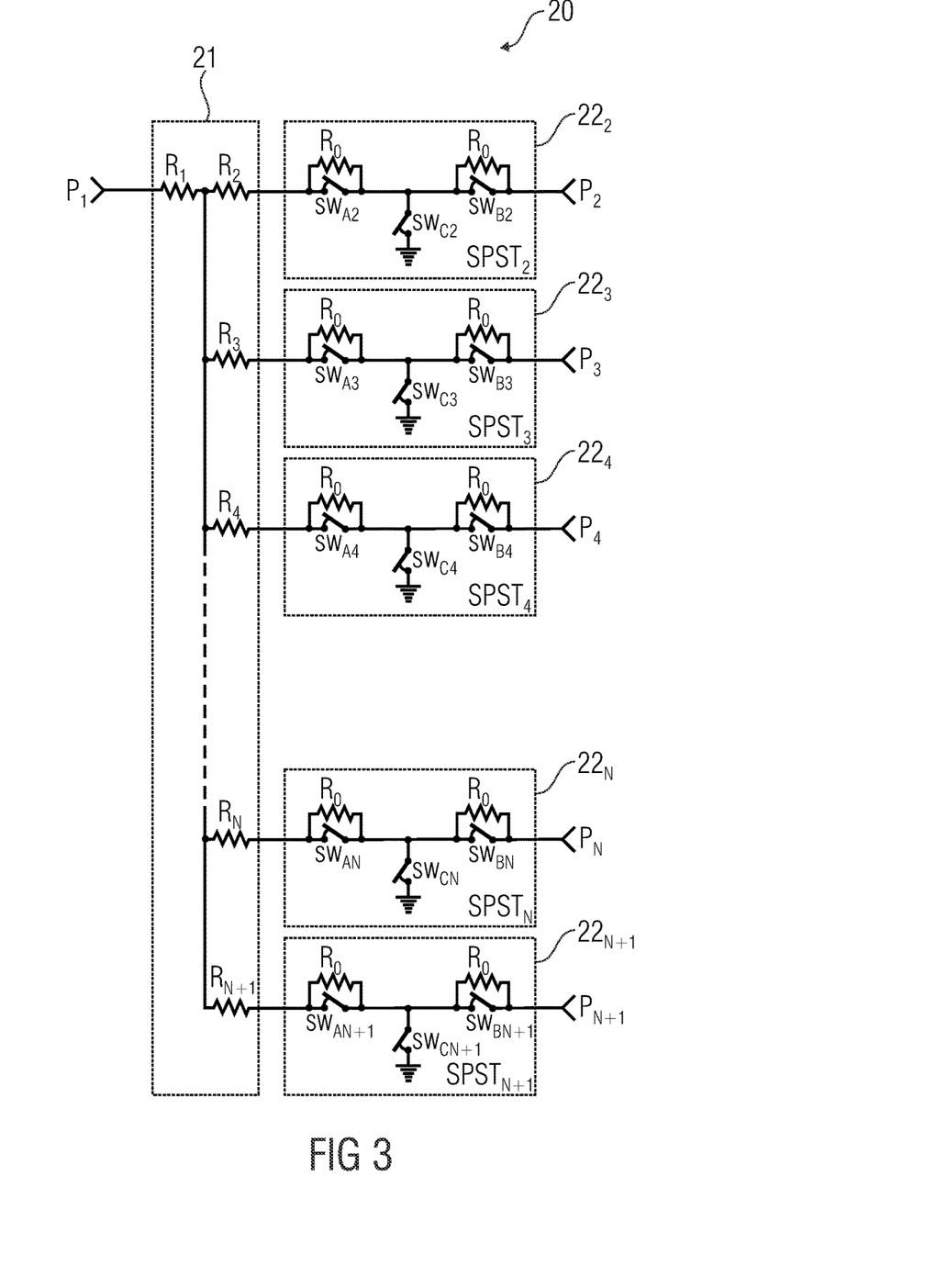
FIG. 3 shows a block diagram of a passive switchable power splitter.

FIG. 3 shows a block diagram of a passive switchable power splitter 20. Note that, the structure shown in FIG. 3 is based on the structure shown in FIG. 1 with the addition of N single pole single throw (SPST) switches $22_2$ to $22_{N+1}$ at the N output ports, denoted with $P_2$ to $P_{N+1}$. Thereby, the SPST switch is a special and simplified case of the SPNT switch with N=1.

In other words, the passive switchable power splitter 20 comprises a passive splitter 21 comprising the N+1 equal valued resistors $R_1$ to $R_{N+1}$ and N single pole single throw (SPST) switches $22_2$ to $22_{N+1}$ connected between the equal valued resistors $R_2$ to $R_{N+1}$ and the output ports $P_2$ to $P_{N+1}$.

The SPST switches $22_2$ to $22_{N+1}$ used in FIG. 3 are absorptive in that they present an ideally perfect impedance match to both of their ports, independent on whether the respective port is transmitting (i.e., active) or not transmitting (i.e., inactive), or in other word, independently from the setting status. This way, the passive splitter 20 shown in FIG. 3 works as in the normal case (all its ports are impedance-matched), while all of the output ports $P_2$ to $P_{N+1}$ can be individually selected to transmit or not.

Figure 4A:
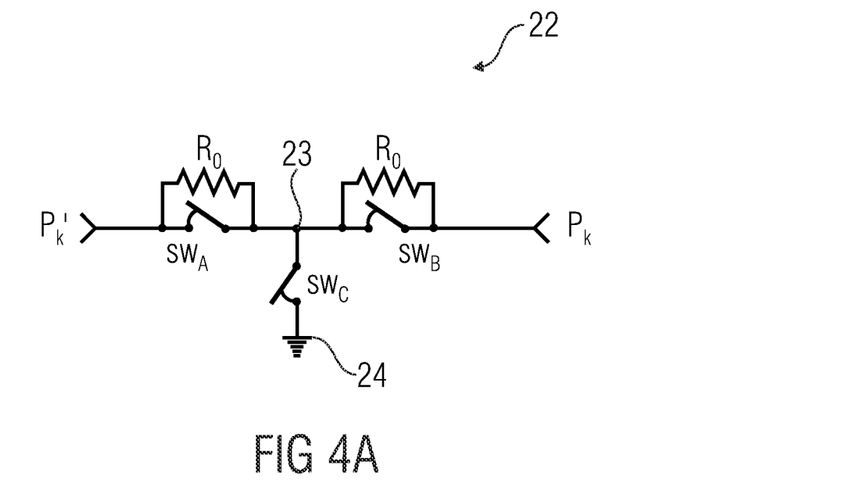
FIG. 4a shows a block diagram of an absorptive SPST with series elements.
Figure 4B:
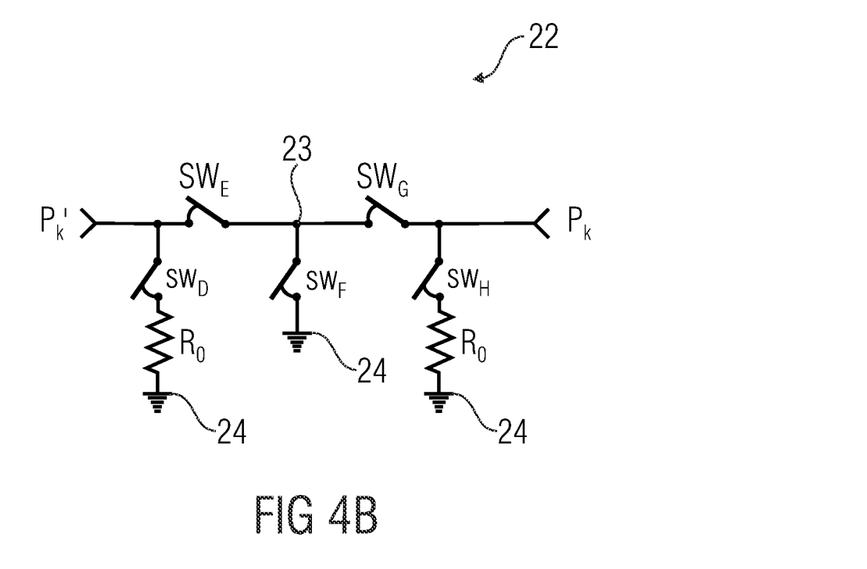
FIG. 4b shows a block diagram of an absorptive SPST with shunt elements.

FIGS. 4a and 4b show two alternative structures for an absorptive SPST switch with impedance matching in the non-transmitting state. More precisely, FIG. 4a shows a realization of an absorptive SPST switch with series elements ($SW_A$ with $R_0$ and $SW_C$ with $R_0$), where FIG. 4b shows a realization of an absorptive SPST switch with shunt elements ($SW_D$ with $R_0$ and $SW_H$ with $R_0$).

The absorptive SPST switch 22 shown in FIG. 4a comprises, an input port $P_k'$, an output port $P_k$, a reference terminal 24, a first switch $SW_A$, a second switch $SW_B$, a third switch $SW_C$, a first reference impedance $R_0$ and a second reference impedance $R_0$.

The first switch $SW_A$ and the second switch $SW_B$ are connected in series between the input port $P_k'$ and the output port $P_k$. A common node 23 between the first switch $SW_A$ and the second switch $SW_B$ is connected via the third switch $SW_C$ to the reference terminal 24. The reference terminal 24 can be configured to provide a reference potential, e.g., ground potential. Thus, the reference terminal 24 can be a ground terminal.

In other words, the first switch $SW_A$, the second switch $SW_B$ and the third switch $SW_C$ form a star connection between the input port $P_k'$, the output port $P_k$ and the reference terminal 24.

The first reference impedance $R_0$ is connected in parallel to the first switch $SW_A$, wherein the second reference impedance $R_0$ is connected in parallel to the second switch $SW_B$.

The absorptive SPST switch 22 shown in FIG. 4b comprise an input port $P_k'$, an output port $P_k$, reference terminal(s) 24, a fourth switch $SW_D$, a fifth switch $SW_E$, a sixth switch $SW_F$, a seventh switch $SW_G$, an eighth switch $SW_H$, a first reference impedance $R_0$ and a second reference impedance $R_0$.

The fifth switch $SW_E$ and the seventh switch $SW_G$ are connected in series between the input port $P_k'$ and the output port $P_k$. A common node 23 between the fifth switch $SW_E$ and the seventh switch $SW_G$ is connected via a sixth switch $SW_F$ to (one of) the reference terminal(s) 24. In other words, the fifth switch $SW_E$, the sixth switch $SW_F$ and the seventh switch $SW_G$ form a star connection between the input port $P_k'$, the output port $P_k$ and (one of) the reference terminal(s) 24.

The fourth switch $SW_D$ and the first reference impedance $R_0$ are connected in series between the input port $P_k'$ (one of) the reference terminal(s) 24. The eighth switch $SW_H$ and the second reference impedance $R_0$ are connected in series between the output port $P_k$ and (one of) the reference terminal(s) 24.

Note that the reference terminal(s) 24 can be ground terminal(s) providing a ground potential.

As already mentioned, either the absorptive SPST switch 22 shown in FIG. 4a or the absorptive SPST switch 22 shown in FIG. 4b can be added to each of the outputs of the passive N-way splitter 10 shown in FIG. 1 to obtain the passive switchable power splitter 20 shown in FIG. 2.

Thereby, each SPST switch 22 has series and shunt switching devices which could assume very high (ideally infinite) or very low (ideally zero) impedance values. When the switches $SW_A$, $SW_B$, $SW_E$ and $SW_G$ are short circuited, the SPST switch 22 connects its two RF ports $P_k'$ and $P_k$ to each other. When the switches $SW_C$, $SW_D$, $SW_F$ and $SW_H$ are short circuited, the SPST switch 22 isolates its two RF ports $P_k'$ and $P_k$ from each other. Transmitting or not, the SPST switch 22 presents matched ports $P_k'$ and $P_k$ to the passive splitter 21 and to the external output ports $P_2$ to $P_{N+1}$.

The main inconvenience of the structure shown in FIG. 3 is its insertion loss, which is depending on the number N of available output ports $P_2$ to $P_{N+1}$, and not on the number M ($M \le N$) of actually selected or active output ports $P_1$ to $P_{M+1}$. Since the transmission coefficient is inversely proportional to the number N of output ports $P_2$ to $P_{N+1}$, the minimum possible insertion loss is not realized when less than the available output ports are selected, i.e., when M<N. The following example may clarify this.

Thereby, it is assumed that the network comprises four (N=4) output ports with $R_0$=50Ω. From equations (1) and (3) the values of the fourth row of the table shown in FIG. 2 are obtained, namely a resistance $R_k$ of 30Ω for each of the equal valued resistors $R_1$ to $R_5$, and an input-output transmission coefficient ($20 \cdot \log_{10}(|s_{k1}|)$) of −12.04 dB.

If only two of the four output ports are selected as transmitting, anyway an input-output transmission coefficient ($20 \cdot \log_{10}(|s_{k1}|)$) of −12.04 dB is obtained, while the second row of the table shown in FIG. 2 states that the transmission coefficient for a passive splitter comprising two output ports should only be −6.02 dB.

Thus, the structure shown in FIG. 3 does not exploit the opportunity offered by the splitter to realize lower insertion loss values in case of reduced number of active output ports. All that is in strong contrast with requirement 5 stating that the insertion loss of the distributing network should be reduced (or even minimized).

Subsequently, embodiments of the present invention are described which reduce or even avoid the above mentioned disadvantages.

In the following description a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of different embodiments described hereinafter may be combined with each other, unless specifically noted otherwise.

Figure 5:
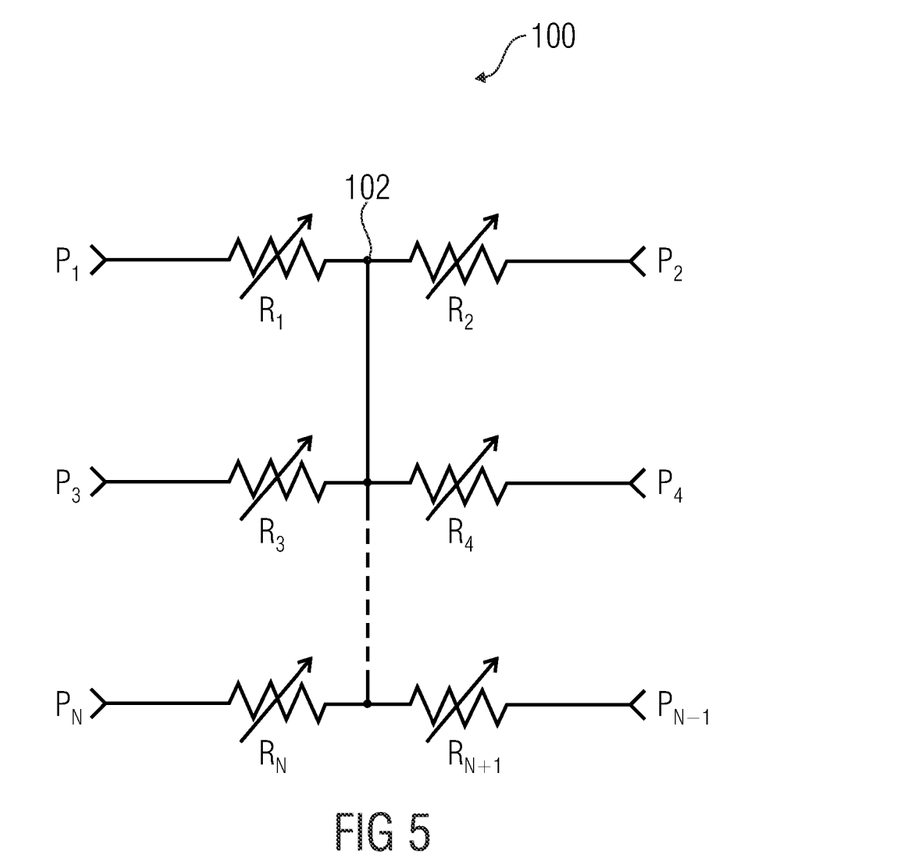
FIG. 5 shows a block diagram of a switchable signal routing circuit according to an embodiment of the present invention.

FIG. 5 shows a block diagram of a switchable signal routing circuit 100 according to an embodiment of the present invention. The switchable signal routing circuit 100 is configured to route a signal between at least one input port and at least one output port, wherein the ports $P_1$ to $P_{N+1}$ are connected via variable resistors $R_1$ to $R_{N+1}$ to a common node 102. The switchable signal routing circuit 100 is configured to set resistance values of the variable resistors $R_1$ to $R_{N+1}$ in dependence on a number L of active ports $P_1$ to $P_L$.

According to the concept of the present invention, the switchable signal routing circuit 100 comprises variable resistors $R_1$ to $R_{N+1}$ instead of fixed equal valued resistors as it is the case in FIG. 1. In other words, the fixed equal valued resistors $R_1$ to $R_{N+1}$ of the passive N-way splitter shown in FIG. 1 are replaced by variable resistors $R_1$ to $R_{N+1}$. Furthermore, the switchable signal routing circuit 100 is configured to set the resistance values of the variable resistors $R_1$ to $R_{N+1}$ in dependence on the number L of active ports $P_1$ to $P_L$.

Thereby, N can be a natural number greater than or equal to two (N≥2), wherein L can be a natural number greater than or equal to two, and smaller than or equal to N+1 (2≤L≤N+1).

For example, the switchable signal routing circuit 100 can comprise 3, 4, 5, 10, 20, 30, 40, 50, 100 or even more ports $P_1$ to $P_{N+1}$.

Note that the switchable signal routing circuit 100 can comprise a plurality of input/output ports $P_1$ to $P_{N+1}$, wherein at least one of the plurality of input/output ports $P_1$ to $P_{N+1}$ is used as input port, and wherein at least another of the plurality of input/output ports $P_1$ to $P_{N+1}$ is used as output port.

For example, the switchable signal routing circuit 100 can comprise one input port $P_1$ and a plurality of output ports $P_2$ to $P_{N+1}$. In that case, the switchable signal routing circuit 100 can be referred to as signal splitter.

Furthermore, the switchable signal routing circuit can comprise a plurality of input ports $P_2$ to $P_{N+1}$ and one output port $P_1$. In that case, the switchable signal routing circuit 100 can be referred to as signal combiner.

Naturally, the switchable signal routing circuit 100 can also comprise a plurality of input ports and a plurality of output ports at the same time. Or in other words, the switchable signal routing circuit 100 can also comprise more than one input port (e.g., 2, 3, 5, 10, 20, 30, 50 or even more input ports) and more than one output port (e.g., 2, 3, 5, 10, 20, 30, 50 or even more output ports) at the same time.

In some embodiments, the switchable signal routing circuit 100 can be configured to receive a control information describing the number L, of active ports $P_1$ to $P_L$ and to automatically set the resistance values of the variable resistors $R_1$ to $R_{N+1}$ in response to the control information.

Thereby, the switchable signal routing circuit 100 can be configured to set the resistance values of all the variable resistors $R_1$ to $R_{N+1}$. Further, the switchable signal routing circuit 100 can be configured to set only the resistance values of variable resistors $R_1$ to $R_L$ connected to active ports $P_1$ to $P_L$.

Further, the switchable signal routing circuit 100 can be configured to individually set the resistance value of each variable resistors $R_1$ to $R_{N+1}$, or each variable resistor $R_1$ to $R_L$ connected to an active port $P_1$ to $P_L$.

Moreover, the switchable signal routing circuit 100 can be configured to set the resistance values of the variable resistors $R_1$ to $R_{N+1}$, or the resistance values of the resistors $R_1$ to $R_L$ connected to active ports $P_1$ to $P_L$ to the same value.

For example, the switchable signal routing circuit 100 can be configured to set the resistance value R of each of the variable resistors $R_1$ to $R_{N+1}$ within a tolerance of 10% (or 5%, or 3%, or 1%) based on the formula:

$$R = R_0 \frac{M-1}{M+1} \qquad (5)$$

wherein M=L−1, wherein L is the number of active ports, and wherein $R_0$ is a reference impedance, e.g., having a resistance of 50Ω (or 60Ω, or 70Ω, or 110Ω).

Further, the switchable signal routing circuit 100 can be configured to terminate inactive ports $P_{L+1}$ to $P_{N+1}$ with a termination resistor.

The termination resistor may provide a reference impedance at the inactive ports $P_{L+1}$ to $P_{N+1}$. For example, the termination resistor may have a reference impedance $R_0$ of 50Ω (or 60Ω, or 70Ω, or 10Ω).

Moreover, the switchable signal routing circuit 100 can be configured to disconnect inactive ports $P_{L+1}$ to $P_{N+1}$ from the common node 102.

The switchable signal routing circuit 100 (N+1 port network) can be used to either distribute one input signal present at one input port to M selectable output ports or to combine M sources connected to M selectable input ports to a common output port. In the first case, the port $P_1$ of the network 100 can be the input port, and the remaining N ports $P_2$ to $P_{N+1}$ can be the output ports. In the second case, the port Pt of the network 100 can be the output port, where the remaining N ports $P_2$ to $P_{N+1}$ can be the input ports.

The reconfigurable distribution network 100 can be purely passive and ideally or almost linear. From this, it follows, that in practice the network 100 is also reciprocal. Therefore, the use cases as source distributer (or splitter) or source combiner are totally equivalent.

Therefore, the following considerations referring to the use case as source distributer may also apply to the use case as source combiner.

In other words, in the following it is assumed that the switchable signal routing circuit 100 comprises one input port $P_1$ and a plurality of output ports $P_2$ to $P_{N+1}$. Thereby, the number of selected or active output ports is denoted with M, wherein M is equal to the number L of active ports (i.e., active input and output ports) minus one (M=L−1).

As already indicated, the basic idea behind this invention is to replace the fixed resistors $R_k$ (1≤k≤N+1) of the passive splitter 10 shown in FIG. 1 with variable controlled ones. More precisely, the L=M+1 resistors connected with the input port $P_1$ and the selected output ports $P_2$ to $P_{L=M+1}$ will assume the value $R_0 \cdot (M−1)/(M+1)$, where M (1≤M≤N) is the number of selected (or active) output ports. The remaining N−M resistors $R_{L+1}$ to $R_{N+1}$, connected with the non-selected output ports $P_{L+1}$ to $P_{N+1}$ will ideally be open-circuit.

The classical implementation of current (voltage) controlled resistors at radio frequency (RF) employs PIN (positive intrinsic negative) diodes or field effect transistors (FET) as described in Giovanni Bianchi: *Microwave and RF Engineering*, Ch. 10, pp. 389-400.

Figure 6A:
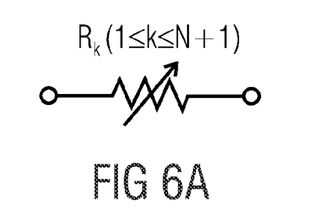
FIG. 6a shows a block diagram of a variable resistor.
Figure 6B:
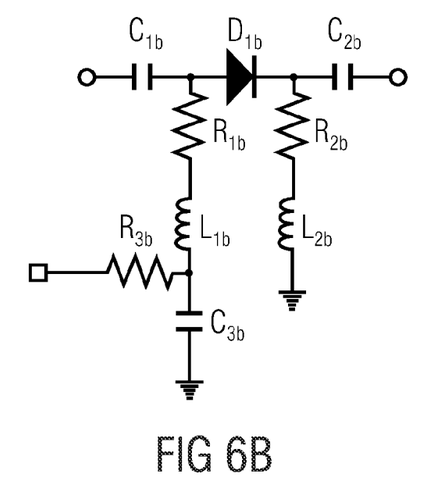
Figure 6C:
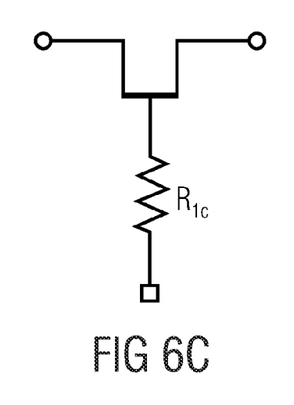

FIG. 6a to 6c summarize the resulting structures. Thereby, FIG. 6a shows a block diagram of a variable resistor $R_k$ (1≤k≤N+1), wherein FIG. 6b shows a PIN diode based (current controlled) implementation of the variable resistor R& shown in FIG. 6a, and wherein FIG. 6c shows a FET based (voltage controlled) implementation of the variable resistor $R_k$ shown in FIG. 6a.

The following problems are the main drawbacks of the variable resistance implementations shown in FIGS. 6a to 6c.

9. The resulting RF resistance could have a critical dependency on the value of the control quantity (current or voltage).
10. The resulting RF resistance also changes with the temperature.
11. The resulting RF resistance for a given control quantity and temperature is changing from piece to piece.
12. The resulting network is inherently non-linear, particularly when the variable resistance is set to the intermediate states (close to its neither lowest nor highest possible impedance).

Problems 9 to 11 are in strong contrast with requirements 6 (stating that the temperature dependency of the distributing network should be reduced (or even minimized)) and requirement 8 (stating that the sensitivity of the distributing network to the manufacturing process variations and the requirement of postproduction alignment should be reduced (or even minimized)). Thereby, particularly problem 10 is in strong contrast with requirement 6.

Moreover, problem 12 tends to prevent the achievement of requirement 7 (stating that the linearity of the distributing network should be increased (or even maximized)).

Figure 7A:
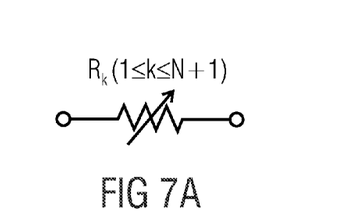
FIG. 7a shows a block diagram of a variable resistor.
Figure 7B:
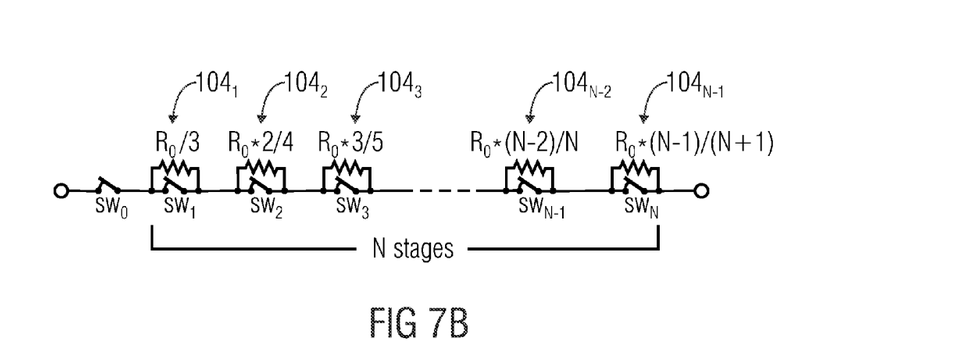
FIG. 7b shows a block diagram of an implementation of the variable resistor shown in FIG. 7a, according to an embodiment of the present invention.
Figure 7C:
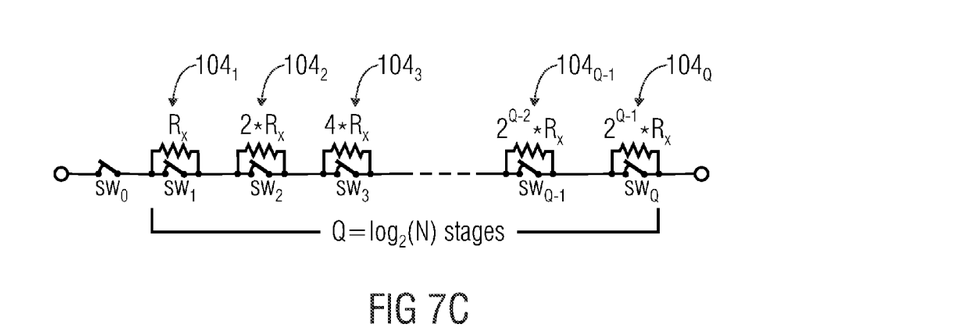
FIG. 7c shows a block diagram of an implementation of the variable resistor shown in FIG. 7a, according to a further embodiment of the present invention.

These consideration suggest the implementation of "digitally" controlled variable resistors, using the schemes of FIGS. 7a to 7c. The switching elements of FIGS. 7a to 7c can be realized with either PIN diodes or FETs, with circuit solutions of the type shown in FIG. 4a or 4b respectively. The peculiarity in the cases of FIGS. 7b and 7c is that the semiconductor devices (PIN diode or FET) is not used at its intermediate resistance, but only at the extreme states, i.e., ideally open or short circuit. That solution removes the problem 9 and strongly reduces problems 10, 11, and 12. Indeed PIN (FET) need a driving current (voltage) above or below given limits for the minimum or maximum resistance status. Moreover, non-linearity, temperature dependency, and parameter variations from piece to piece are typically much smaller in the extreme than in the intermediate impedance regions.

FIG. 7a shows a block diagram of a variable resistor according to an embodiment of the present invention. The variable resistor $R_k$ shown in FIG. 7a may be used for implementing the variable resistors $R_1$ to $R_{N+1}$ of the switchable signal routing circuit 100 shown in FIG. 5, wherein k is a natural number greater than or equal to one, and smaller than or equal to N+1 (1≤k≤N+1).

FIG. 7b shows a block diagram of an implementation of the variable resistor $R_k$ shown in FIG. 7a, according to an embodiment of the present invention.

The variable resistor $R_k$ shown in FIG. 7b can be connected between the common node 102 and one of the plurality of ports $P_1$ to $P_{N+1}$. Thus, the switchable signal routing circuit 100 may comprise a plurality of the variable resistors $R_k$ connected between the plurality of ports $P_1$ to $P_{N+1}$ and the common node 102.

Each of the variable resistors $R_k$ can comprise a switch $SW_0$ in order to disconnect the respective port when it is in the inactive state from the common node 102. Note that although shown in FIG. 7b as being part of the switchable resistor $R_k$, the switch $SW_0$ may also be implemented externally to the variable resistor $R_k$. In that case, the switch $SW_0$ may be connected in series with the variable resistor $R_k$ between the common node 102 and the respective port, in order to disconnect the port when it is in inactive state from the common node 102 (and to connect the port when it is in an active state to the common node).

Moreover, each variable resistor $R_k$ can comprise a plurality of switchable resistor units $104_1$ to $104_{N-1}$ connected in series, wherein the switchable resistor units $104_1$ to $104_{N-1}$ are switchable between active and inactive.

Note that a resistor unit may be in its active state when its resistance is being effective, where the switchable resistor unit may be in its inactive state when its resistance is being ineffective, e.g. bypassed.

The plurality of switchable resistor units $104_1$ to $104_{N-1}$ may comprise different resistance values, wherein the switchable signal routing circuit 100 can be configured to set the resistance value of the respective variable resistor $R_k$ by selectively activating one or more respective resistor units $104_1$ to $104_{N-1}$.

Each of the plurality of switchable resistor units $104_1$ to $104_{N-1}$ may comprise a parallel connection of a resistor element and a switch.

As indicated in FIG. 7b, each variable resistor $R_k$ of the plurality of variable resistors $R_1$ to $R_{N+1}$ can comprise N switchable resistor units $104_1$ to $104_{N-1}$, wherein the resistance value $R_j$ of the j-th switchable resistor unit of the N switchable resistor units $104_1$ to $104_{N-1}$ is given within a tolerance of ±10% (or 5%, or 3%, or 1%) by the formula:

$$R_j = R_0 \frac{j-1}{j+1} \quad (1 \leq j \leq N) \tag{6}$$

wherein j is an index of the switchable resistor unit $104_1$ to $104_{N-1}$, wherein N is a number of ports $P_1$ to $N_{N+1}$ of the switchable signal routing circuit 100 minus one, and wherein $R_0$ is a reference impedance, such as 50Ω (or 60Ω, or 70Ω, or 110Ω).

Thereby, the switchable signal routing circuit 100 can be configured to activate the switchable resistor unit $104j$ having the index j=M=L−1 and to deactivate the other switchable resistor units.

In other words, the solution of FIG. 7b comprises N+1 switching elements $SW_1$ to $SW_N$ bypassing N resistors The $0^{th}$ switching element, denoted with $SW_0$, can be used to prevent the variable resistance structure (which is anyway terminated with $R_0$ at the respective output port when its inactive, or at the terminal of the variable resistor connected to the respective inactive output port) to load the resistor common node 102, when the output port corresponding to the resistance itself is not transmitting. The remaining N switching elements are all short-circuited but one, which is $SW_{j=M}$ if M output ports are selected (1≤M≤N) to transmit. In the special case of one single selected output port (M=1), all the switching elements of the resistors relative to that port and to the input are short circuited, while all the others are open-circuited.

A positive side-effect of the switch $SW_0$ is that the non selected output is (at least ideally) now isolated from the splitter. Therefore, the corresponding output SPST switch 22 does not need to be absorptive on the splitter side any more, i.e., $SW_A$ or $SW_D$ in FIG. 4a or 4b can be removed, together with the associated $R_0$. This will simplify the structure while simultaneously improving insertion and return-loss.

Note that the resistance distribution of FIG. 7b is not unique. Other possible implementations with different switch actuation strategies are possible, such as $R_0 \cdot 1/3$ for $SW_1$, $R_0 \cdot (2/4 - 1/3)$ for $SW_2$, $R_0 \cdot (3/5 - 2/4 - 1/3)$ for $SW_3$, and so on. In this case, all the M switching elements from $SW_1$ to $SW_M$ will be open, while the remaining N−M switching elements from $SW_{M+1}$ to $SW_N$ will be short-circuited.

FIG. 7c shows a block diagram of an implementation of the variable resistor $R_k$ shown in FIG. 7a, according to a further embodiment of the present invention.

Each variable resistor $R_k$ can comprise a plurality of switchable resistor units $104_1$ to $104_{N-1}$ connected in series, wherein the switchable resistor units $104_1$ to $104_{N-1}$ are switchable between active and inactive.

Note that a resistor unit may be in its active state when its resistance is being effective, where the switchable resistor unit may be in its inactive state when its resistance is being ineffective, e.g. bypassed.

The plurality of switchable resistor units $104_1$ to $104_{N-1}$ may comprise different resistance values, wherein the switchable signal routing circuit 100 can be configured to set the resistance value of the respective variable resistor $R_k$ by selectively activating one or more respective resistor units $104_1$ to $104_{N-1}$.

Each of the plurality of switchable resistor units $104_1$ to $104_{N-1}$ may comprise a parallel connection of a resistor element and a switch.

As shown in FIG. 7c, each resistor $R_k$ of the variable resistors $R_1$ to $R_{N+1}$ can comprise Q switchable resistor units $104_1$ to $104_Q$, wherein the resistance value $R_i$ of the i-th switchable resistor unit of the Q switchable resistor $104_1$ to $104_Q$ units is given within a tolerance of ±10% (or 5%, or 7%, or 10%) by the formula:

$$R_i = 2^{I-1} R_X (1 \leq I \leq Q) \tag{7}$$

wherein i is an index of the switchable resistor unit, wherein Q=$\log_2$N, wherein N is a number of ports $P_1$ to $P_{N+1}$ of the switchable signal routing 100 circuit minus one, and wherein $R_x$ is a given impedance.

In other words, the various resistance values that may be used for different numbers of selected output ports can be approximated with the binary structure shown in FIG. 7c. This simplifies the structure, although at the expense of a lower accuracy in the realized resistance value, at least in the ideal case.

In practice, the consistently lower number of switching elements Q=$\lfloor \log_2(N) \rfloor$ gives much lower RF parasitics, which probably overcompensates the lack of accuracy.

Figure 7D:
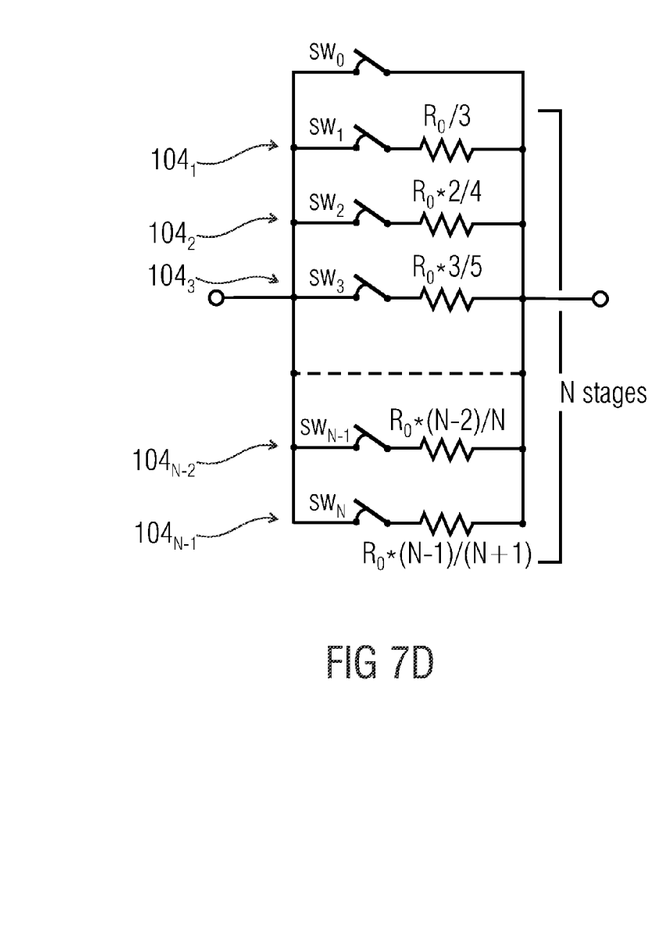
FIG. 7d shows a block diagram of an implementation of the variable resistor shown in FIG. 7a, according to a further embodiment of the present invention.

FIG. 7d shows a block diagram shows a block diagram of an implementation of the variable resistor $R_k$ shown in FIG. 7a, according to a further embodiment of the present invention.

Moreover, each variable resistor $R_k$ can comprise a plurality of switchable resistor units $104_1$ to $104_{N-1}$ connected in parallel, wherein the switchable resistor units $104_1$ to $104_{N-1}$ are switchable between active and inactive.

Note that a resistor unit may be in its active state when its resistance is being effective, where the switchable resistor unit may be in its inactive state when its resistance is being ineffective, e.g. bypassed.

The plurality of switchable resistor units $104_1$ to $104_{N-1}$ may comprise different resistance values, wherein the switchable signal routing circuit 100 can be configured to set the resistance value of the respective variable resistor $R_k$ by selectively activating one or more respective resistor units $104_1$ to $104_{N-1}$.

Each of the plurality of switchable resistor units $104_1$ to $104_{N-1}$ may comprise a series connection of a resistor element and a switch.

As indicated in FIG. 74, each variable resistor $R_k$ of the plurality of variable resistors $R_1$ to $R_{N+1}$ can comprise N switchable resistor units $104_1$ to $104_{N-1}$, wherein the resistance value $R_j$ of the j-th switchable resistor unit of the N switchable resistor units $104_1$ to $104_{N-1}$ is given within a tolerance of ±10% (or 5%, or 3%, or 1%) by the formula:

$$R_j = R_0 \frac{j-1}{j+1} \quad (1 \leq j \leq N) \tag{6}$$

wherein j is an index of the switchable resistor unit $104_1$ to $104_{N-1}$, wherein N is a number of ports $P_1$ to $P_{N+1}$ of the switchable signal muting circuit 100 minus one, and wherein $R_0$ is a reference impedance, such as 50Ω (or 60Ω, or 70Ω, or 110Ω).

Thereby, the switchable signal routing circuit 100 can be configured to activate the switchable resistor unit $104_j$ having the index j=M=L-1 and to deactivate the other switchable resistor units.

Figure 7E:
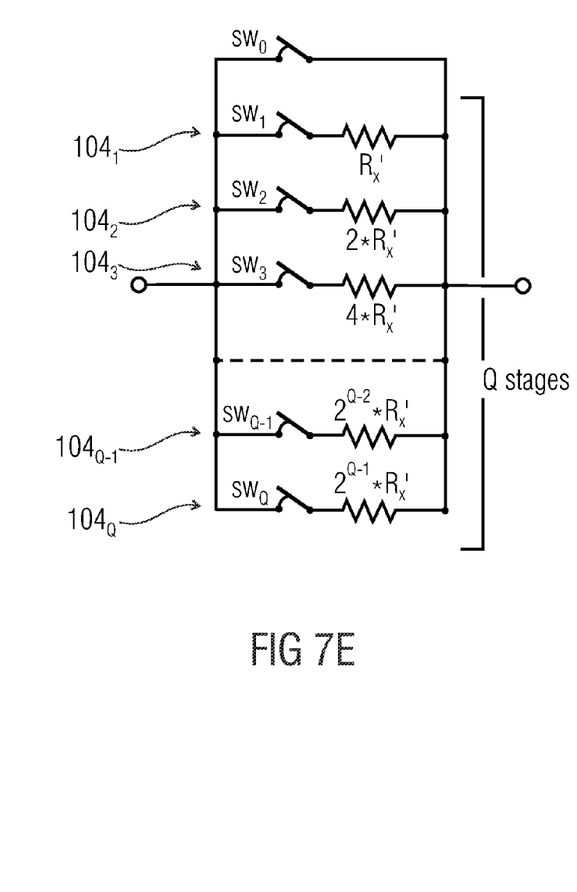
FIG. 7e shows a block diagram of an implementation of the variable resistor shown in FIG. 7a, according to a further embodiment of the present invention.

FIG. 7e shows a block diagram of an implementation of the variable resistor $R_k$ shown in FIG. 7a, according to a further embodiment of the present invention.

Each variable resistor $R_k$ can comprise a plurality of switchable resistor units $104_1$ to $104_{N-1}$ connected in parallel, wherein the switchable resistor units $104_1$ to $104_{N-1}$ are switchable between active and inactive.

Note that a resistor unit may be in its active state when its resistance is being effective, where the switchable resistor unit may be in its inactive state when its resistance is being ineffective, e.g. bypassed.

The plurality of switchable resistor units $104_1$ to $104_{N-1}$ may comprise different resistance values, wherein the switchable signal routing circuit 100 can be configured to set the resistance value of the respective variable resistor $R_k$ by selectively activating one or more respective resistor units $104_1$ to $104_{N-1}$.

Each of the plurality of switchable resistor units $104_1$ to $104_{N-1}$ may comprise a series connection of a resistor element and a switch.

As shown in FIG. 7e, each resistor $R_k$ of the variable resistors $R_1$ to $R_{N+1}$ can comprise Q switchable resistor units $104_1$ to $104_Q$, wherein the resistance value $R_i$ of the i-th switchable resistor unit of the Q switchable resistor $104_1$ to $104_Q$ units is given within a tolerance of ±10% (or 5%, or 7%, or 10%) by the formula:

$$R_i = 2^{i-1} R_X (1 \leq i \leq Q) \tag{7}$$

wherein i is an index of the switchable resistor unit, wherein $Q=\log_2 N$, wherein N is a number of ports $P_1$ to $P_{N+1}$ of the switchable signal routing 100 circuit minus one, and wherein $R_x$ is a given impedance.

To summarize, the circuit implementation of FIG. 7b uses N+1 series cells each comprising one FET with one shunt resistor (the apparent exception is $SW_0$, which has no shunt resistor but that cell can be considered as one FET with infinite resistance in shunt). A totally (at least by principle) equivalent implementation is shown in FIG. 7d. The network in FIG. 7d can realize exactly the same resistance values [0, $R_0/3$, ... $R_0 \cdot (N-1)/(N+1)$, ∞] as the one in FIG. 7b, just with a different actuation strategy of the switching FETs.

Similarly, the circuit of FIG. 7c can be also implemented as the one of FIG. 7e, i.e. the latter also realizes 20 different resistance values (plus of course open and short-circuit). The calculation strategy is identical to the case of the network in FIG. 7c, just with different resistance values in the various states (Remember that the networks of FIGS. 7c and 7d as well do not exactly realize the resistance that may be used in the various states. Both give approximated values, the values of the two networks are not the same, but the resulting reflection coefficients (9) could be made identical for the two networks).

Figure 8:
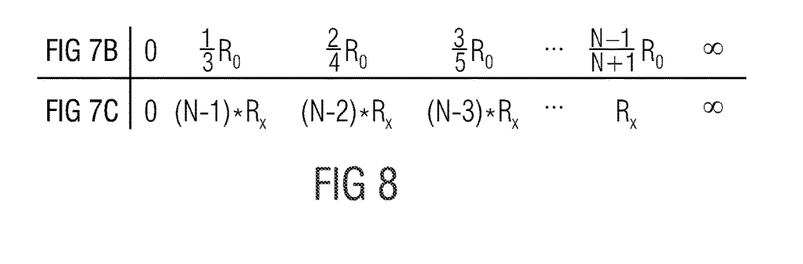
FIG. 8 lists in a table different resistance values which the variable resistor shown in FIG. 7b and the variable resistor shown in FIG. 7c can provide.

FIG. 8 lists in a table the resistance values which the variable resistor $R_k$ shown in FIG. 7b and the variable resistor $R_k$ shown in FIG. 7c can provide. Thereby, the structure shown in FIG. 7b realizes the resistance values listed in the first row of the table shown in FIG. 8, wherein the structure shown in FIG. 5c realizes the resistance values listed in the second row of the table shown in FIG. 8.

Figure 9:
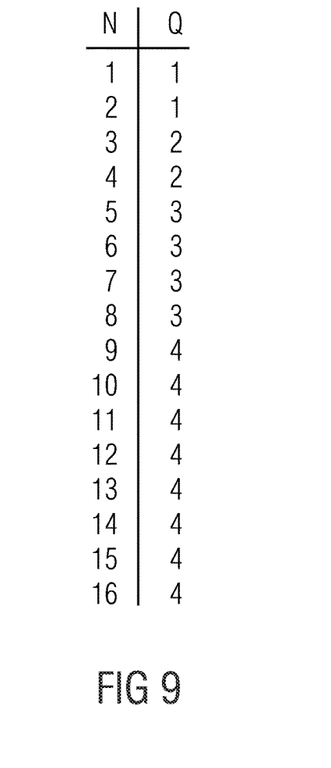
FIG. 9 compares in a table the number of resistor units which may use the variable resistor shown in FIG. 7b and the number of resistor units which may use the variable resistor shown in FIG. 7c for providing the same number of different resistance values.

FIG. 9 compares in a table the number N of resistor units $104_1$ to $104_N$ which may use the variable resistor $R_k$ shown in FIG. 7b and the number Q of resistor units $104_1$ to $104_Q$ which may use the variable resistor $R_k$ shown in FIG. 7c for providing the same number of different resistance values.

In other words, FIG. 9 lists in a table the number of switching elements that may be used for the exact (FIG. 7b) and binary (FIG. 7c) realization on the first and second column, respectively.

In the following, the component values (or resistance values) realized with the binary digitally variable resistor $R_k$ shown in FIG. 7c are discussed. The resistance of any resistor $R_k = R^{(M)}$ assumes the value among the $2^Q$ possible ones, i.e., 0, Rx, 2·Rx, 3·Rx, ... $(2^Q-1) \cdot R_X$. The resistance presented at the input port $P_1$ is:

$$R_{IN} = R^{(M)} + \frac{R^{(M)} + R_0}{M} \tag{8}$$

The resulting reflection coefficient is:

$$\rho_{IN} = \frac{R_{IN} - R_0}{R_{IN} + R_0} = \frac{R^{(M)} + \frac{R^{(M)} + R_0}{M} - R_0}{R^{(M)} + \frac{R^{(M)} + R_0}{M} + R_0} = \frac{(1+M)\frac{R^{(M)}}{R_0} + 1 - M}{(1+M)\frac{R^{(M)}}{R_0} + 1 + M} \tag{9}$$

A possible design method may comprise choosing the bit resistance $R_X$ and N among the $2^Q$ available states of the binary stepped variable resistor $R_k$, in order to minimize the amplitude of the reflection coefficient (8). To that regard, one possible degree of freedom is the value to consider, i.e., the worst case among the different number of selected ports, or the average between the values, er different combinations.

For example, if N=4 then the optimum bit resistance for the best worst-case return-loss is $R_X$ a 12.1Ω, which gives a worst case return-loss of about 22.67 dB for M=2.

In the special (but frequent) case of an integer power of two number of outputs (N=2$^{N\_INTEGER}$, where N_INTEGER is an integer number, for instance N=2, 4, 8, . . . ) the number of available states is not larger than the one that may be used. In that case, the design procedure is limited to the choice of $R_X$, unless, more stages are introduced in the binary stepped variable resistor, in order to gain flexibility and better impedance matching.

To summarize, the above described switchable signal routing circuit 100 (linear N+1 port network) can, but is not limited to, split a signal present at a common input port to M selectable output ports, or to combine signals present at M selectable input ports to a common output port. Thereby, the switchable signal routing circuit 100 fulfills (at least some) of the following requirements (or constraints):

1. The switchable signal routing circuit is broadband, (ideally from DC to infinite frequency). The lower frequency limit of the circuit can be DC (0 Hz). The upper frequency limit can be ideally infinite (in the case of ideal FET). A practical value for the maximum usable frequency results from the combination of several factors, i.e. number of ports (N+1 in denotation herein, the higher N the lower the maximum frequency), acceptable performance degradation respect to the ideal case. FET technology (i.e. the real FETs behaves not as ideal controlled switches, rather they present finite on resistance, parasitic reactance in both ON and OFF states), type of assembly technology (which also adds parasitic reactance). Typical numbers could be N=4, Gallium Arsenide Monolithic Microwave Integrated Circuit (Ga—As MMIC) technology, 1-2 dB of degradation on the insertion loss at the highest frequency [compared to the ideal case of equation (2), which gives $s_{21}$=0.25 i.e. −12 dB], maximum frequency=10 GHz.
2. Each of the N output ports $P_2$ to $P_{N+1}$ can be individually selected as transmitting or not transmitting one.
3. The input port $P_1$ and all of the M output ports $P_2$ to $P_{M+1}$ selected to transmit can be impedance matched.
4. Not only the M transmitting ports $P_2$ to $P_{M+1}$ but also the remaining output ports $P_{M+2}$ to $P_{N+1}$ can be impedance matched, i.e. all of the N+1 ports of the device 100 can be impedance matched, independently of which port(s) is(are) transmitting.
5. The insertion loss of the switchable signal routing circuit 100 is reduced (or even minimized).
6. The temperature dependency of the switchable signal routing circuit 100 is reduced (or even minimized).
7. The linearity of the switchable signal routing circuit 100 is increased (or even maximized).
8. The sensitivity of the switchable signal muting circuit to the manufacturing process variations and the requirement of post-production alignment is reduced (or even minimized).

Further embodiments provide a method for operating a switchable signal routing circuit for routing a signal between at least one input port and at least one output port, wherein the ports are connected by means of variable resistors to a common node. The method comprises setting resistance values of the variable resistors in dependence on a number of active ports.

Thereby, the method may comprise varying the number of active ports, and automatically setting the resistance values of the variable resistors in response to the varying of the number of active ports.

Further embodiments provide a variable minimum-insertion loss power combiner structure (switchable signal routing circuit), i.e. FIG. 1 or FIG. 2 with fixed resistors $R_1$ to $R_{N+1}$ replaced with variable controlled ones. The variable resistors $R_1$ to $R_{N+1}$ can be implemented as shown in FIG. 7b or 7c.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A switchable signal routing circuit comprising:
a plurality of ports including at least one input port and at least one output port;
a common node; and
a plurality of variable resistors,
wherein each of the variable resistors is coupled between a respective one of the plurality of ports and the common node, and
wherein the switchable signal routing circuit is configured to set resistance values of the variable resistors in dependence on a number of active ones of the plurality of ports, and wherein the switchable signal routing circuit is configured to terminate inactive ports with a termination resistor.

2. The switchable signal routing circuit according to claim 1, wherein the switchable signal routing circuit is configured to receive a control information describing the number of active ports and to automatically set the resistance values of the variable resistors in response to the control information.

3. The switchable signal routing circuit according to claim 1, wherein the switchable signal routing circuit is configured to disconnect the inactive ports from the common node.

4. The switchable signal routing circuit according to claim 3, wherein the switchable signal routing circuit comprises switches connected in series with the variable resistors between the common node and the ports, in order to disconnect the inactive ports from the common node.

5. The switchable signal routing circuit according to claim 1, wherein each of the variable resistors comprises a plurality of switchable resistor units connected in series, wherein the switchable resistor units are switchable between active and inactive.

6. The switchable signal routing circuit according to claim 5, wherein each of the plurality of switchable resistor units comprises a parallel connection of a resistor element and a switch.

7. The switchable signal routing circuit according to claim 1, wherein each of the variable resistors comprises a plurality of switchable resistor units connected in parallel, wherein the switchable resistor units are switchable between active and inactive.

8. The switchable signal routing circuit according to claim 7, wherein each of the plurality of switchable resistor units comprises a series connection of a resistor element and a switch.

9. The switchable signal routing circuit according to claim 5, wherein the plurality of switchable resistor units comprise different resistance values, wherein the switchable signal routing circuit is configured to set the resistance value of the respective variable resistor of the plurality of variable resistors by selectively activating one or more respective resistor units.

10. The switchable signal routing circuit according to claim 1, wherein the switchable signal routing circuit is configured to set the resistance value of each of the variable resistors within a tolerance of ±10% based on the formula:

$$R = R_0 \frac{M-1}{M+1}$$

wherein M=L−1, wherein L is the number of active ports, and wherein $R_0$ is a reference impedance.

11. The switchable signal routing circuit according to claim 5, wherein each of the variable resistors comprises N switchable resistor units, wherein the resistance value $R_j$ of the j-th switchable resistor unit of the N switchable resistor units is given within a tolerance of ±10% by the formula:

$$R_j = R_0 \frac{j-1}{j+1} \quad (1 \le j \le N)$$

wherein j is an index of the switchable resistor unit, wherein N is a number of ports of the switchable signal routing circuit minus one, and wherein $R_0$ is a reference impedance.

12. The switchable signal routing circuit according to claim 11, wherein the switchable signal routing circuit is configured to activate the switchable resistor unit comprising the index j=L−1 and to deactivate the other switchable resistor units, wherein L is the number of active ports.

13. The switchable signal routing circuit according to claim 5, wherein each of the variable resistors comprises Q switchable resistor units, wherein the resistance value $R_i$ of the i-th switchable resistor unit of the Q switchable resistor units is given within a tolerance of ±10% by the formula:

$$R_i = 2^{I-1} R_x (1 \le I \le Q)$$

wherein i is an index of the switchable resistor unit, wherein Q=$\log_2$N, wherein N is a number of ports of the switchable signal routing circuit minus one, and wherein $R_x$ is a given impedance.

14. The switchable signal routing circuit according to claim 1, wherein the switchable signal routing circuit comprises one input port and a plurality of output ports.

15. The switchable signal routing circuit according to claim 1, wherein the switchable signal routing circuit comprises a plurality of input ports and one output port.

16. A method for operating a switchable signal routing circuit for routing a signal between at least one input port and at least one output port, the method comprising:
coupling a plurality of ports together each through a respective one of a plurality of variable resistors, wherein a number of the plurality of ports are active and any other ports are inactive, wherein the switchable signal routing circuit is configured to terminate inactive ports with a termination resistor; and
setting resistance values of the plurality of variable resistors in dependence on the number of active ports.

17. The method according to claim 16, wherein the method comprises:
varying the number of active ports; and
automatically setting the resistance values of the variable resistors in response to the varying of the number of active ports.

18. A computer program comprising a program code for performing, when running on a computer or microprocessor, a method according to claim 16.

19. A device comprising:
a plurality of ports;
a common node;
a plurality of variable resistors each coupled between a respective one of the plurality of ports and the common node, wherein each variable resistor includes a plurality of switchable resistor units adapted to selectively set a resistance value of the variable resistors in dependence on a number of active ones of the plurality of ports in response to control information; and
a termination resistor that terminates inactive ports of the plurality of ports.

* * * * *